United States Patent [19]
Reinberg

[11] Patent Number: 5,460,908
[45] Date of Patent: Oct. 24, 1995

[54] PHASE SHIFTING RETICAL FABRICATION METHOD

[75] Inventor: Alan R. Reinberg, Westport, Conn.

[73] Assignee: Micron Technology, Inc., Boise, Id.

[21] Appl. No.: 228,163

[22] Filed: Apr. 13, 1994

Related U.S. Application Data

[63] Continuation of Ser. No. 739,749, Aug. 2, 1991, abandoned.
[51] Int. Cl.⁶ ........................................... G03F 9/00
[52] U.S. Cl. ................... 430/5; 430/269; 430/321; 430/322; 430/396; 156/635.1
[58] Field of Search .................. 430/5, 269, 32.1, 430/32.2, 396; 156/635, 646

[56] References Cited

U.S. PATENT DOCUMENTS

| | | | |
|---|---|---|---|
| 4,459,325 | 7/1984 | Nozawa et al. | 430/313 |
| 4,957,835 | 9/1990 | Aden | 430/5 |
| 5,045,417 | 9/1991 | Okamoto | 430/5 |

OTHER PUBLICATIONS

McGraw–Hill Publishing Company, "Microchip Fabrication" pp. 327–328.

*Primary Examiner*—S. Rosasco
*Attorney, Agent, or Firm*—Angus C. Fox, III

[57] ABSTRACT

A method of fabricating a phase shifting reticle that can be used as a mask in photolithographic processes such as semiconductor wafer patterning. A transparent quartz substrate is coated with a film of an oxidizable silicon material. The silicon is then coated with a material suitable for isolating the silicon material from an oxidizing environment. A resist coating is placed atop the isolation material, developed and etched, exposing the isolation in a predetermined pattern. The isolation material is etched and the substrate placed in an oxidizing environment. The silicon material expands to a predetermined thickness, forming a phase shifter on the substrate. Next, the remaining isolation material and unoxidized silicon are removed, forming transmission regions adjacent the phase shifters. Then the remaining resist is removed to form opaque or light blocking areas on the substrate to complete formation of a phase shifting reticle.

16 Claims, 6 Drawing Sheets

PHASE SHIFTING RETICAL FABRICATION METHOD

This application is a continuation of application Ser. No. filed Aug. 2, 1991 now abandoned.

FIELD OF THE INVENTION

This invention relates to a novel process particularly suited to fabricating phase shifting reticles or masks that can be used in fine line photolithography such as used in semiconductor manufacture.

BACKGROUND OF THE INVENTION

As semiconductor manufacturing advances from very large scale integration (VLSI) to ultra-large scale integration (ULSI), the devices on semiconductor wafers shrink to sub-micron dimensions and the circuit density increases to several million transistors per die. In order to accomplish this high device packing density, smaller and smaller feature sizes are required. This may include the width and spacing of interconnecting lines in the service geometry such as corners and edges, of various features.

The requirement of small feature sizes with close spacing between adjacent features requires high resolution photolithographic processes. In general, photolithography utilizes a beam of light, such as ultra violet (UV) waves, to transfer a pattern from a photolithographic mask to a photo resist coating through an imaging lens. The mask includes opaque and transparent regions such that the shapes match those openings in the resist coating in the desired or predetermined pattern.

Early prior art masks, and referring now to FIG. 1A–1D, were made by coating a quartz blank 10 with a chrome 12 or other light blocking material layer upon which was laid a coating of photoresist material 16. An electron beam 15 used to write the desired pattern on the photoresist coating 16 after which the photoresist is developed. Next, and referring to FIG. 1C, a chrome etch is performed on the exposed regions, after which the resist is stripped. As shown in FIG. 1D, a reticle having transparent openings 14 and opaque area 12 has been formed on the quartz blank 10. Unfortunately, reticles thus formed are limited in resolution capability due to the effects of diffraction.

One technique currently being investigated for improving the resolution of the photolithographic process is known as phase shift lithography. With phase shift lithography, the interference of light rays is used to overcome diffraction and improve the resolution and depth of optical images projected on to a target. In phase shift lithography, the phase of an exposure light at the object is controlled such that adjacent bright areas are formed preferably 180° out of phase with one another. Dark regions are thus produced between the bright areas by disruptive interference even when diffraction would otherwise cause these areas to be lit. This technique improves total resolution at the object, providing a line/space resolution 50% to 70% greater than that possible using conventional transmission means.

An early patent in this field, U.S. Pat. No. 4,360,586 to Flanders et al, is directed to exposing periodic optical features on an object surface. The features were characterized by a spacial period "p". According to the invention, a source of radiant energy of wavelength $\lambda$ illuminates a surface to be exposed through a mask having a spatial period separated from the surface by a distance approximately $S_n = P^2/n\ \lambda$, where n is an integer greater than 1.

With respect to semiconductor fabrication numerous laboratory techniques have been proposed to employ phase shifting in the photo patterning of semiconductor wafers. Most of the work in this area has centered around either "Alternating Phase Shifting", "Subresolution Phase Shifting", or "Rim Phase Shifting" experiments. In general, in each of these techniques a phase shift mask or reticle is constructed in repetitive patterns in three distinct layers of material. An opaque layer on the mask provides areas that allow no light transmission therethrough, a transparent layer provides areas which allow close to 100 percent of light to pass through and a phase shift layer provides areas which allow close to 100 percent of light to pass through, but phase shifted 180° from the light passing through the transparent areas. The transparent areas and phase shifting areas are situated so that light rays defracted through each area is cancelled out in a darkened area there between. This creates the pattern of dark and bright areas which can be used to clearly delineate features of a pattern on a photopattern wafer.

"Alternating Phase Shifting" is a spatial frequency reduction concept similar to the method disclosed in the Flanders et al patent. It is characterized by a pattern of features alternately covered by a phase shifting layer. "Subresolution Phase Shifting" promotes edge intensity cut off by placing a subresolution feature adjacent to a primary image and covering it with a phase shifting layer. "Rim Phase Shifting" overhangs a phase shifter over a chrome mask pattern.

In general, these phase shifting techniques have not been adapted to large scale semiconductor manufacturing processes. One problem with applying phase shifting lithography into practical use, in manufacturing semiconductors, is the difficulty in reticle mask making, inspection, and repair. The process must be compatible with the manufacturing conditions, (ie. inexpensive, repetitive, clean) and prior art laboratory techniques have not heretofore met these criterion.

A representative state of the art semiconductor laboratory process for making a phase shift mask or reticle is the process generally disclosed in the Flanders et al patent. This process is shown in FIGS. 2A–2D and is termed an "additive process".

The "additive process" may be used to fabricate a reticle or hard copy of an individual drawing for a semiconductor circuit layout. The reticle may then be used directly as a mask in the photopatterning process or may be used to produce a photomask. As an example, the reticle may be used to pattern a wafer surface in a stepped pattern transfer. DRAMs and SRAMs because of their repetitive nature are adapted to manufacture in this manner.

Referring now to FIG. 1, with the "additive process," a transparent quartz substrate 10 has a film of an opaque material 12 such as chromium (CR) pattern thereon. The chromium 12 may be deposited and patterned onto the substrate 10 by a conventional process such as electron beam lithography. In the example of FIG. 1, the pattern is a periodic arrangement of chrome 12 and spaces 14 patterned on the quartz substrate 10.

Referring now to FIG. 2A, a thin film layer of phase shifter material 18 such as (SiO$_2$) is deposited over the pattern chrome 12 and spaces 14. The phase shift material is selected from those with suitable optical properties and is deposited with a thickness equivalent to a half wavelength ($\lambda/2$) at the exposure source of interest. Thus, the phase shift ultimately obtained as a function of the thickness "t" and refractive index of the phase shifter material, which are preferably selected to provide a 180° phase shift.

Next, the phase shift material is coated with a resist 20 sensitive to electron beam exposure. The desired phase shift pattern is then written onto the resist 20 and the resist pattern thus obtained is developed and removed. Next, the phase shift film 18 is etched in the regions where the resist was removed. Following this step, the resist is then stripped, leaving a phase shifter 18 in every other opening 14 between the chrome 12. This provides an alternating phase shifting pattern as previously explained.

Problems with the "additive process" are that it is defect prone, inconsistent, a less manufacturable procedure and, thus, not as suitable for large scale manufacturing. Deposition of the phase shifter material is prone to particulate contamination. These contaminants may cause subsequent patterning errors of the finished wafer. Another problem with the "additive process" is that it is difficult to accurately control the thickness of phase shifter 18 uniformally across the quartz plate 10. A still further problem is the lack of an etch stop between the phase shifter film and the quartz substrate (particularly when SiO$_2$ is used for both. A uniform timed etch accurate across the whole of the quartz plate is difficult to achieve.

In the finished reticle, each phase shifter 18 preferably has a thickness "t" (FIG. 2C) that produces a 180° phase shift for light passing there through. This optimal thickness can be determined by the formula:

$$t = \frac{i\lambda}{2(n-1)}$$

where t= thickness of phase shift material i= an odd integer

λ= equals wavelength of exposure light n= refractive index of phase shifter material of the exposure wavelength Any deviation from this optimal thickness adversely effects the phase shift ultimately obtained. An "edge effect" may occur, for example, at the edge of a phase shifter 18 deposited over the edge of a chrome light blocker 12. This may be due to the conformal deposition of the phase shifter material 18 over the chrome light blocker 12 which causes the phase shifter 18 to be slightly thicker at the edges.

Another prior art method for forming a phase shift reticle is shown in FIGS. 3A–3C. As before, a pattern of opaque light blockers 12 such as chromium (CR) is formed on a quartz substrate 10. As shown in FIG. 3A, photoresist 20 is then patterned on the chrome light blockers 12 in every other opening 14. As shown in FIG. 3B, openings 14 not covered with photoresist are then etched to form phase shifter openings 22 etched back to a depth "d" into the substrate of the quartz substrate 10. Light passing through an etched back phase shifter opening 22 is phase shifted relative to light passing through an adjacent transmission opening 14 which must travel through the full thickness of the quartz substrate 10.

This prior art reticle fabrication method is also subject to several disadvantages. First, the etch depth "d" into the quartz 10 requires a highly controlled uniform etch over a relatively large (example—5") reticle surface. Since it is necessary to phase shift within a margin of ±10° or less, this translates to an etch tolerance of about 5%. This is difficult to achieve under manufacturing conditions.

Further, the prior art etch back technique shown in FIGS. 3A–3C causes a finite loss in light transmission due to the roughness of the exterior surface of the etch back phase shifter openings 22. Another disadvantage of this etch back technique is the difficult requirement of having to accurately pattern photoresist 20 over the topology of the opaque light blockers 12.

The process of the present invention is directed to a novel process that overcomes these prior art limitations. The process of the invention provides a clean, repetitive technique for forming accurate phase shifting reticles suitable for large scale semiconductor manufacturing.

SUMMARY OF THE INVENTION

In accordance with the present invention, a novel method of fabricating phase shifting reticles or masks for semiconductor photolithography is provided. The method of the invention, simply stated, utilizes a transparent substrate covered with amorphous or polycrystalline silicon. Typically, a silicon thickness of approximately 0.1μ is sufficient to block ultra violet radiation. A layer of silicon nitride is then deposited on top of the silicon which is then covered with a resist layer which is exposed and etched in a usual manner known in the art. After the resist is patterned and removed, the top layer of exposed nitride is etched. The remaining resist is then removed and the plate is exposed to an oxidizing environment. Oxidizing the deposited amorphous or polycrystalline silicon causes it to expand, forming phase shifting areas on the substrate. Another layer of resist is then patterned on the nitride layer. Next, the nitride not covered with resist is etched and the underlying remaining silicon is removed, to provide transparent areas on the substrate. Finally, the second resist coating is removed to provide opaque areas on the substrate.

Numerous other features objects and advantages of the invention will become apparent from the following specification when read in conjunction with the accompanying drawing in which:

DETAILED DESCRIPTION OF THE PREFERRED EMBODIMENT

As used herein, the term reticle and mask are interchangeable. Additionally, the disclosure refers to various materials which are electrically either conductive, insulating, or semiconducting, although the completed semiconductor circuit itself is usually referred to as a "semiconductor."

Referring to FIGS. 4A–4D, a method of fabricating a phase shift reticle in accordance with the invention is shown.

Figure 1A:
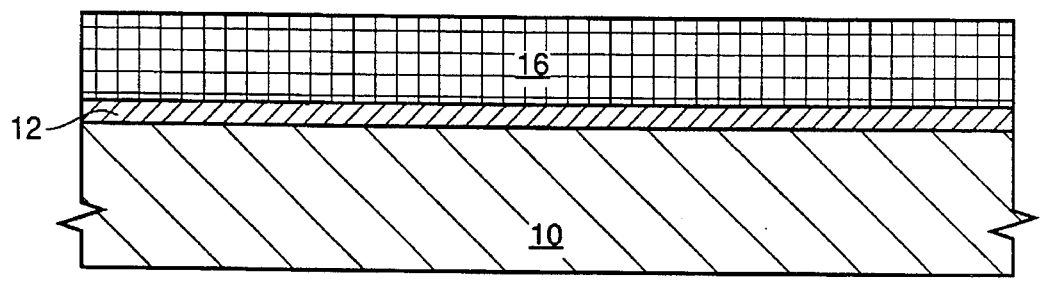
FIGS. 1A–1C are diagrammatic representations of the steps involved for forming chrome blockers on a quartz substrate.
Figure 1B:
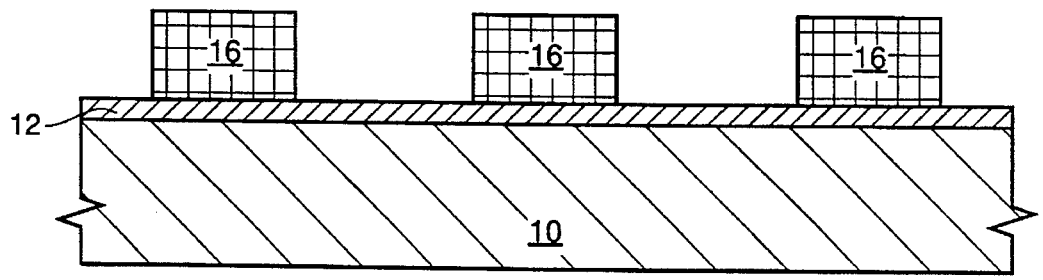
Figure 1C:
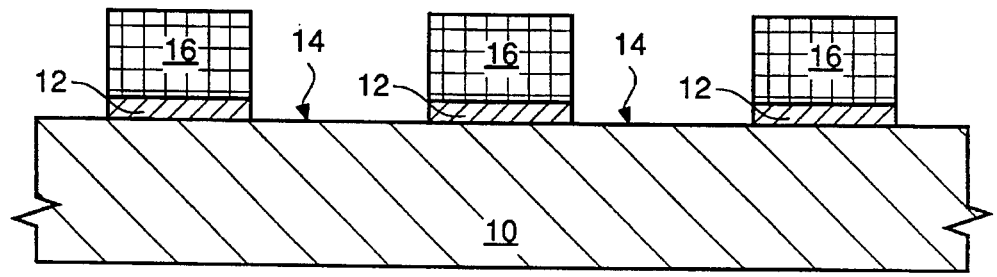
Figure 1D:
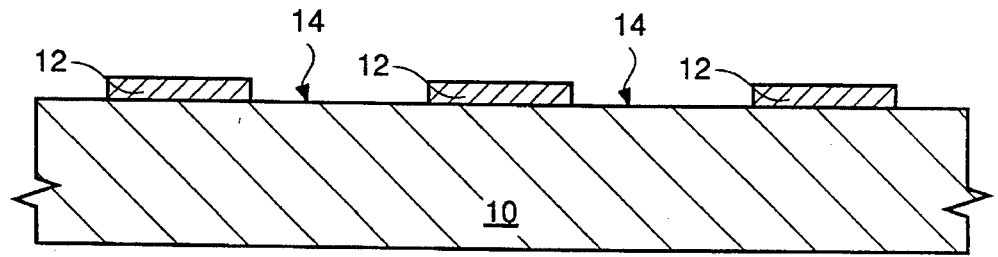
Figure 2A:
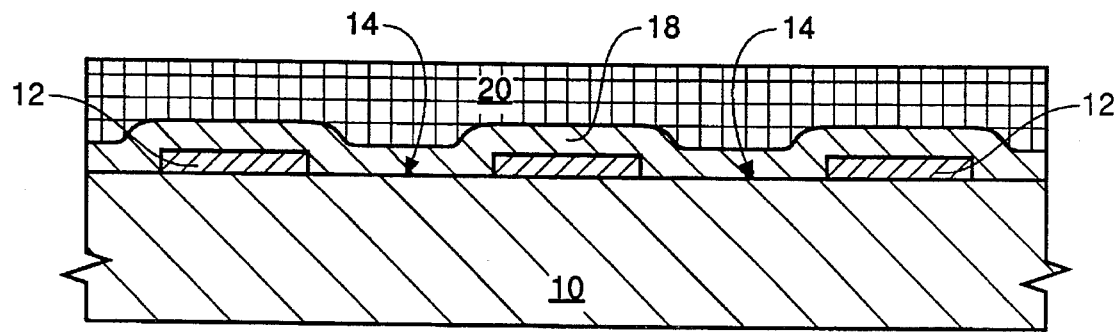
FIGS. 2A–2C are diagrammatic representations of the steps involved in fabricating a phase shift reticle in accordance with a prior art "additive process"
Figure 2B:
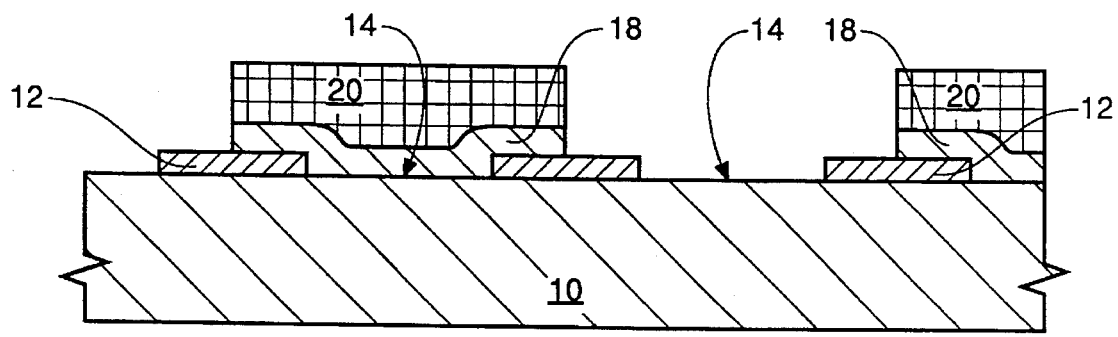
Figure 2C:
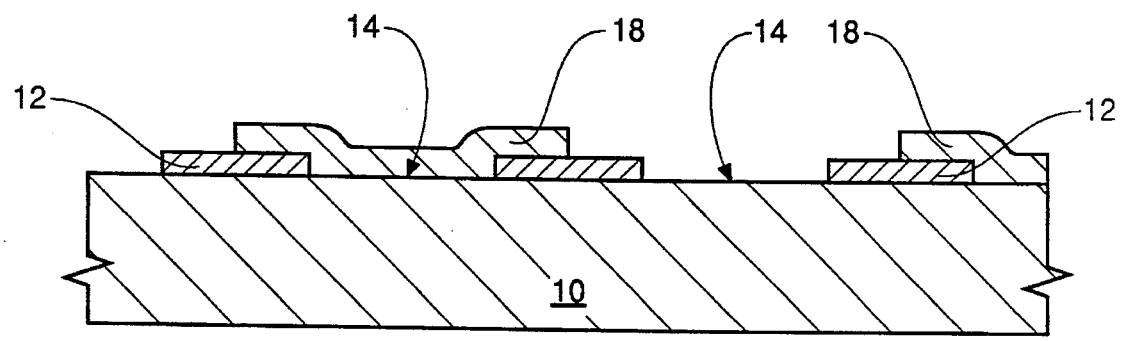
Figure 3A:
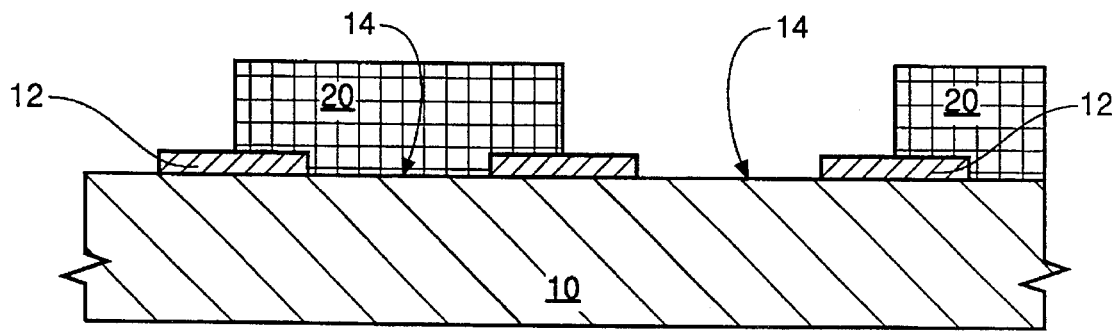
FIGS. 3A–3C are diagrammatic representations of the steps involved in fabricating a phase shift reticle in accordance with the prior art etch back process.
Figure 3B:
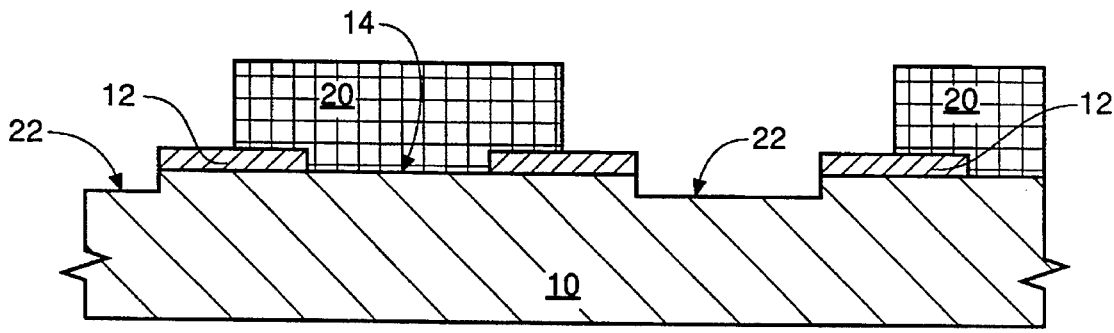
Figure 3C:
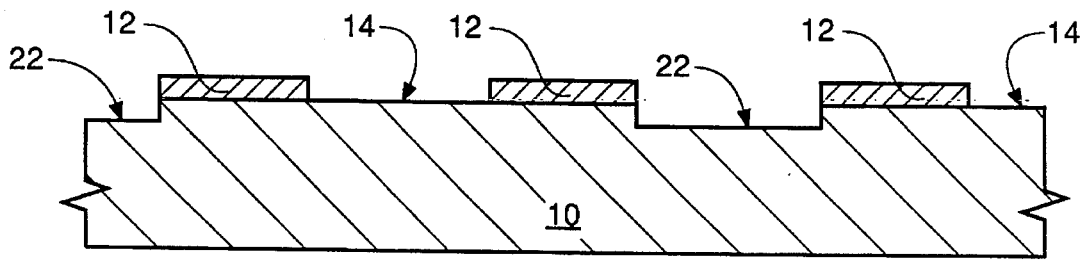
Figure 4A:
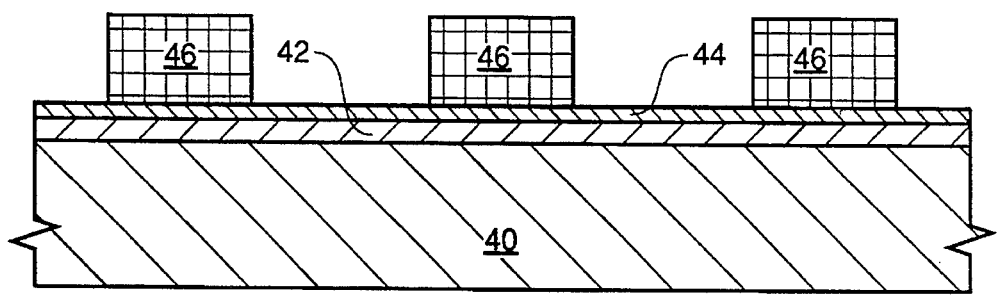
FIGS. 4A–4D are diagrammatic representations of the steps involved in fabricating a phase shift reticle in accordance with the present invention.
Figure 4B:
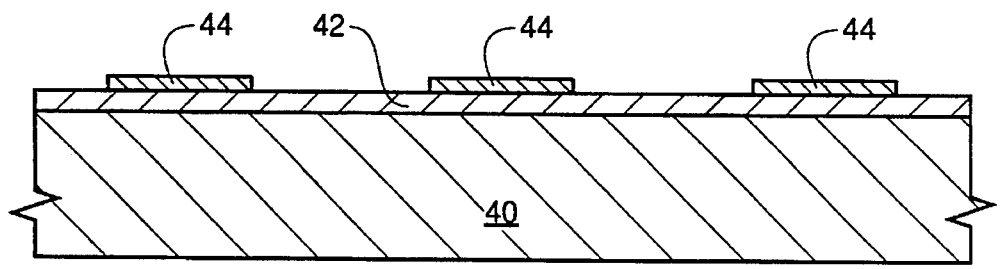
Figure 4C:
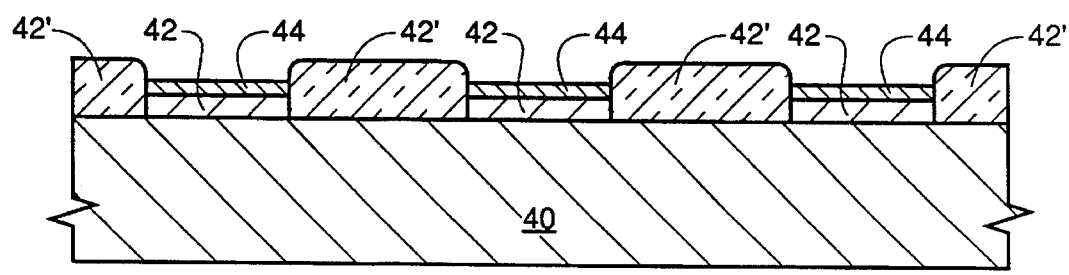
Figure 4D:
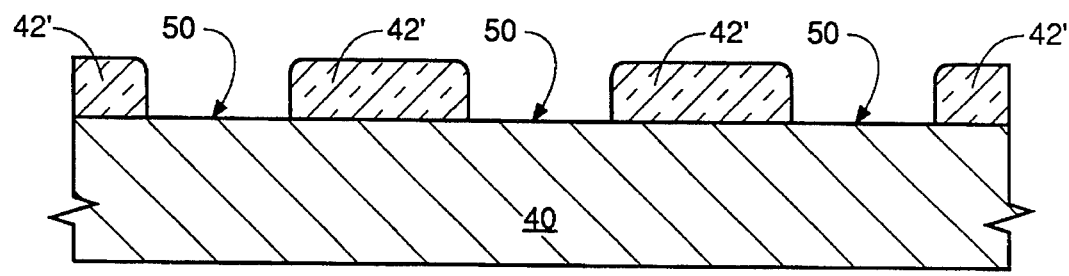

The method of the invention includes the steps of:

Coating a transparent quartz substrate with a layer of amorphous or polycrystalline silicon, coating the silicon with a layer of silicon nitride, and coating and patterning a layer of resist on the silicon nitride layer (FIG. 4A);

Exposing the resist, etching the nitride layer, and thereafter removing the resist (FIG. 4B);

Exposing the layered and patterned substrate to an oxidizing environment (FIG. 4C); and Stripping the remaining nitride and unoxidized silicon from the substrate to form the phase shift and transmission areas of the reticle (FIG. 4D).

Referring now to FIG. 4A, a phase shift reticle fabricated in accordance with the invention is formed on a transparent substrate 40. In an illustrative embodiment of the invention, the transparent substrate 40 is quartz (QZ). Quartz is a highly purified glass favored for its optical properties, inherent stability at high temperatures and its cleanliness. Quartz is typically utilized as the mask substrate material in optical projection systems and is highly transparent in the deep UV region. Alternately, the transparent substrate 40 may be formed of any other transparent material having suitable optical and mechanical properties.

In the present case, the objective is to provide transmission, phase-shift and opaque regions on the quartz substrate 40 at the exposure wavelength. The exposure wavelength may, for example, be at a wavelength of about 248 nm for KrF excimer laser lithography. Photolithography may also be preformed in the range of the UV i-line (365 nm) or the UV g-line (436 nm) which are also common wavelengths used in photolithography processes.

Referring in particular to FIG. 4A, an amorphous or polycrystalline silicon coating 42 is deposited on a surface of quartz substrate 40. Silicon coating 42 may be deposited using various methods, such as chemical vapored deposition (CVD), plasma enhanced CVD (PECVD), sputter deposition, thermal evaporation or any other convenient method of depositing the amorphous or polycrystalline silicon coating. Additionally, it will be apparent that other materials, such as germanium and the like, capable of controlled oxidation expansion may be used in place of silicon.

The thickness of the silicon coating 42 is selected so that when it is totally oxidized, as will be hereinafter described, the thickness of the resulting silicon oxide layer 42 is dimensioned to provide the requisite phase shift with respect to a transmission region 50 in the substrate 40. As silicon, when fully oxidized, produces a film approximately twice the thickness of the original unoxidized layer, an example for producing a thickness that is desirable for many phase shifting applications would be to provide a silicon layer 42 approximately 1,250 angstroms thick, so that when oxidized, the oxidized silicon layer 42' would be approximately 2,500 angstroms thick.

Prior to oxidation, however, and still referring to FIG. 4A, a layer of silicon nitride 44 is positioned atop the layer of silicon 42, again by any convenient method such as CVD or PECVD. Next, the silicon nitride is covered with a resist layer 46 which is exposed and patterned in a conventional manner. That is, it may be exposed and patterned using electron beam, laser beam, or any suitable lithographic method. The resist 46 is then developed, and the exposed portion of the layer of nitride 44 is etched. Although any suitable etching means may be used, it has been found that plasma etching for its anisotropic characteristics is particularly suitable for this step.

Next, and referring now to FIG. 4B, the resist is removed leaving the glass substrate 40 with a coating of amorphous or polycrystalline silicon 42 and a patterned layer of silicon nitride 44 on top of the silicon layer 42.

Referring now to FIG. 4C, quartz substrate 40 is exposed to an oxidizing environment. The deposited amorphous or polycrystalline 42 silicon will oxidize at a higher rate than is usual for single crystal silicon, producing a film 42' approximately twice the thickness of the original unoxidized layer. The silicon nitride 44 pattern acts as an oxidation barrier to the underlying silicon 42 film in exactly the same manner as in a standard MOS LOCOS processing.

Next, the silicon nitride 44 pattern is etched, using either wet or dry means and the underlying remaining silicon 42 is removed. Preferably, the silicon 42 is removed using a wet etch process.

Referring now to FIG. 4D, there is depicted a quartz substrate 40 having patterned transmission area 50 and phase shifters 42' positioned on the surface in accordance with the present invention.

In some instances, and referring again to FIG. 4A, it may be desirable to apply an adhesion layer (not shown) prior to deposition of the amorphous or polycrystalline silicon layer 42. Any suitable material, in particular a thin film of silicon nitride (again, not shown) may be deposited on top of the quartz substrate 40 prior to deposition of the amorphous or polycrystalline silicon layer 42 to bond the amorphous or polycrystalline layer 42 more tightly to the substrate 40. The adhesion layer will be removed along with the unoxidized silicon layer 42, following the oxidizing process. Also, the thickness and transmission properties of the adhesion layer must be of the oxidized silicon layer 42'.

Figure 5A:
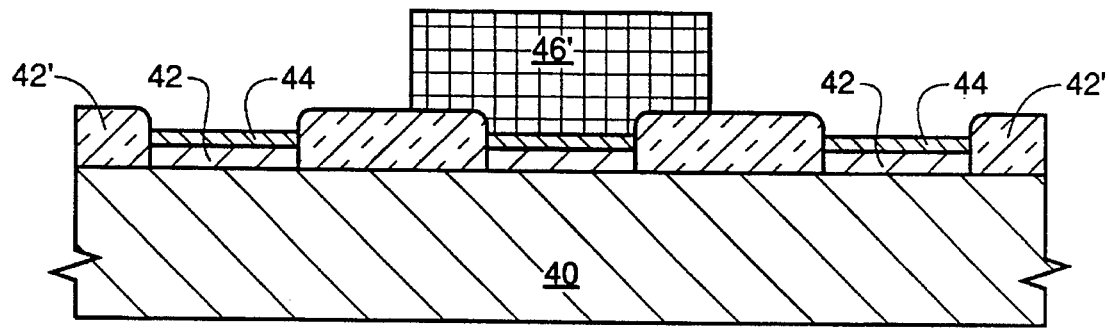
FIGS. 5A and 5B are diagrammatic representations of the steps involved in adding opaque or light blocking areas to the phase shifting reticle of FIG. 4D in accordance with the present invention.
Figure 5B:
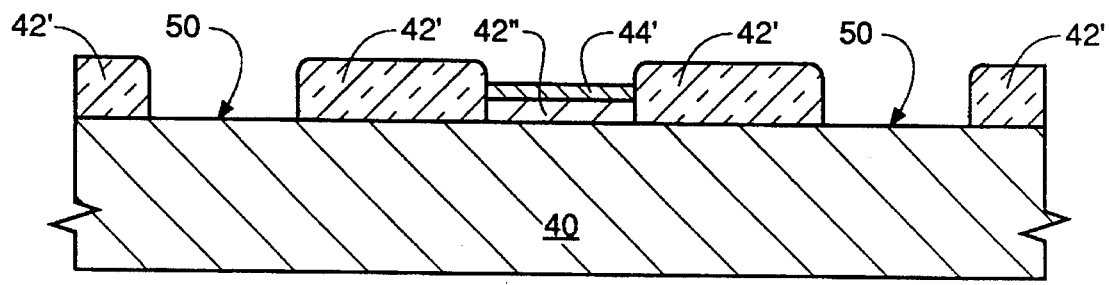

To produce a completed phase shifting reticle, and referring now to FIG. 5A, it is desirable to provide for opaque areas of the mask. Accordingly, subsequent to oxidation of the exposed amorphous or polycrystalline silicon 42' and prior to removal of the silicon nitride 44 and any unexposed, an oxidized amorphous or polycrystalline silicon 42, a second resist coating 46' is applied in a predetermined pattern such that the opaque regions can be provided. The opaque regions consist of areas where the unoxidized silicon 42 covered by silicon nitride 44 is not removed during processing so that transmission of light through substrate 40 is precluded. In depositing the resist 46' during this step, the alignment needed is not critical so long as the silicon 42 and nitride 44 in the areas to remain opaque are covered. Accordingly, the resist 46' may also cover some of the adjacent oxidized regions of the amorphous or polycrystalline silicon 42' without deleterious effects on the mask.

Next, any exposed nitride 44 and underlying silicon 42 are etched and removed in the manner, as above described. The resist 46' protects the regions where it is desired that the silicon 42" and nitride 44' remain, forming opaque regions in the desired pattern.

Figure 6A:
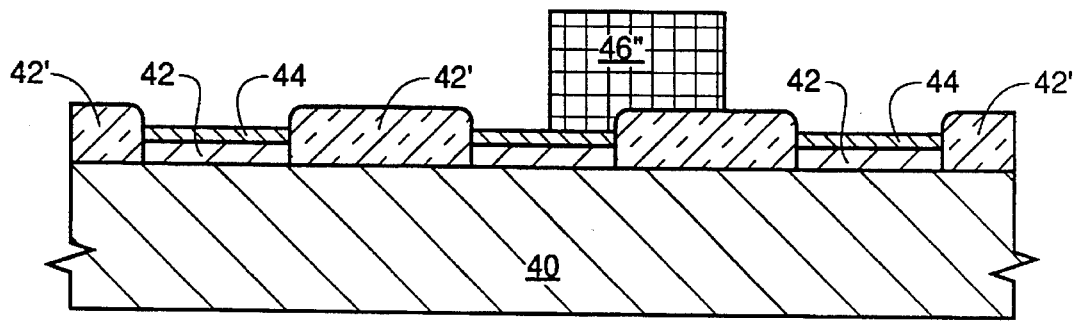
FIGS. 6A and 6B are diagrammatic representations of the steps involved in adding partial opaque or light blocking areas to the phase shifting reticle of FIG. 4D in accordance with the present invention.
Figure 6B:
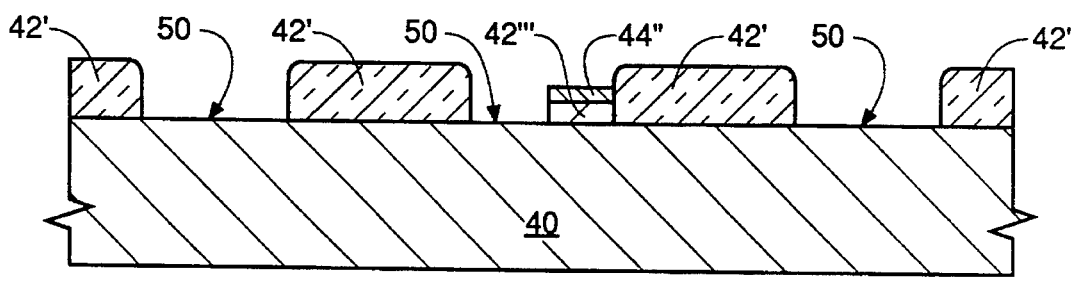

Further, and referring now to FIG. 6A, it may be desirable to provide an opaque region extending from a phase shift regions onto a transmission region. Accordingly, and as above described, resist 46' is again positioned over the silicon nitride 44 on areas where it is desired to have an opaque region remain. Again following the above described steps, the resist 46" protects the desired opaque regions while any exposed nitride 44 and underlying unoxidized silicon 42 are etched and removed as above described. Upon removal and referring now to FIG. 6B it may be seen an opaque region consisting of silicon 42''' and nitride 44'' extending between a phase shift region 42' to a transmission region 50.

Accordingly, as above described, a photomask may be formed having two adjoining regions differing only in phase, and with opaque regions adjoining a short path length region without additionally oxidized silicon, or an opaque region adjoining a long path length region.

Using the LOCOS method, oxidization of the substrate 42 can be accurately controlled to achieve 180° phase shifts in each of the phase shifters 42' or to provide any phase shift from 0° to 180°. Additionally, the above described process can be economically accomplished using equipment and techniques that are known in the art.

In the illustrated embodiment of the invention, the reticle included a simple pattern of lines and spaces. The method of invention, however, can be used to fabricate reticles in other patterns including, for example, wiring patterns, word lines, bit lines, whole lines, and black patterns. Further, the application of this invention is not limited to semiconductor lithography alone but may be utilized in applications requiring the tooling of fine-line masks or reticles.

While the process of the invention has been described with reference to a preferred embodiment thereof, it will be apparent to those skilled in the art, certain changes and modifications can be made without departing from the scope of the invention as defined by the following claims.

I claim:

1. A method of forming a phase shifting reticle comprising:

coating a transparent substrate with a film of an oxidizable material;

coating the oxidizable material with a film of an isolation material;

covering portions of the isolation material with a resist in a preselected pattern so as to leave the remaining isolation material exposed;

removing the exposed isolation material thereby exposing portions of the underlying oxidizable material;

removing the resist;

reacting the oxidizable material with an oxidizing environment to cause the oxidizable material to expand a predetermined amount, forming phase shifters on the substrate; and removing the remaining isolation material and unoxidized oxidizable material to form a phase shifting reticle having transmission areas adjacent the phase shifters on the substrate.

2. The method of claim 1 wherein said isolation material is silicon nitride.

3. The method of claim 2 wherein said oxidizable material is amorphous silicon.

4. The method of claim 2 wherein said oxidizable material is polycrystalline silicon.

5. The method of claim 2 wherein said oxidizable material is germanium.

6. The method of claim 1 wherein said oxidizable material is amorphous silicon.

7. The method of claim 1 wherein said oxidizable material is polycrystalline silicon.

8. The method of claim 1 wherein said oxidizable material is germanium.

9. A method of forming a phase shifting reticle comprising:

coating a transparent substrate with a film of an oxidizable material;

coating the oxidizable material with a film of an isolation material;

covering a part of the isolation material with a resist in a preselected pattern so as to leave the remaining isolation material exposed;

removing the exposed isolation material thereby exposing portions of the underlying oxidizable material;

removing the resist;

reacting the oxidizable material with an oxidizing environment to cause the oxidizable material to expand a predetermined amount, forming phase shifters on the substrate;

covering a part of the remaining isolation material with a resist in a second, different preselected pattern;

removing the remaining, exposed isolation material and unoxidized oxidizable material; and removing the resist to form a phase shifting reticle having opaque, light blocking areas and transmission areas adjacent the phase shifters on the substrate.

10. The method of claim 9 wherein said isolation material is silicon nitride.

11. The method of claim 10 wherein said oxidizable material is amorphous silicon.

12. The method of claim 10 wherein said oxidizable material is polycrystalline silicon.

13. The method of claim 10 wherein said oxidizable material is germanium.

14. The method of claim 9 wherein said oxidizable material is amorphous silicon.

15. The method of claim 9 wherein said oxidizable material is polycrystalline silicon.

16. The method of claim 9 wherein said oxidizable material is germanium.

* * * * *